United States Patent [19]

Berkcan

[11] Patent Number: 5,438,257
[45] Date of Patent: Aug. 1, 1995

[54] REDUCED MAGNETIC FLUX CURRENT SENSOR

[75] Inventor: Ertugrul Berkcan, Schenectady, N.Y.

[73] Assignee: General Electric Company, Schenectady, N.Y.

[21] Appl. No.: 119,267

[22] Filed: Sep. 9, 1993

[51] Int. Cl.$^6$ ............................................. G01R 33/00
[52] U.S. Cl. .......................... 324/117 R; 324/117 H; 324/127
[58] Field of Search ................ 324/117 R, 117 H, 127

[56] References Cited

U.S. PATENT DOCUMENTS

| | | |
|---|---|---|
| 2,831,164 | 4/1958 | Johnson . |
| 3,372,334 | 3/1968 | Fenoglio et al. . |
| 3,573,616 | 4/1971 | Kahen ............................... 324/117 H |
| 3,665,357 | 5/1972 | Tsubouchi et al. . |
| 3,921,069 | 11/1975 | Milkovic . |
| 3,995,210 | 11/1976 | Milkovic . |
| 4,140,961 | 2/1979 | Akamatsu . |
| 4,182,982 | 1/1980 | Wolf et al. . |
| 4,240,059 | 12/1980 | Wolf et al. . |
| 4,255,704 | 3/1981 | Milkovic . |
| 4,255,705 | 3/1981 | Milkovic . |
| 4,278,940 | 7/1981 | Milkovic . |
| 4,286,214 | 8/1981 | Milkovic . |
| 4,414,510 | 11/1983 | Milkovic . |
| 4,492,919 | 1/1985 | Milkovic . |
| 4,494,068 | 1/1985 | Ley et al. . |
| 4,495,463 | 1/1985 | Milkovic . |
| 4,513,274 | 4/1985 | Halder . |
| 4,580,095 | 4/1986 | DeVries . |
| 4,626,778 | 12/1986 | Friedl . |
| 4,684,827 | 8/1987 | Ohms . |
| 4,794,326 | 12/1988 | Friedl . |
| 4,810,989 | 3/1989 | Brandenberg et al. . |
| 4,835,463 | 5/1989 | Baran et al. . |
| 4,894,610 | 1/1990 | Friedl . |
| 4,912,396 | 3/1990 | Groenenboom ................. 324/117 R |
| 4,939,451 | 7/1990 | Baran et al. . |
| 4,947,107 | 8/1990 | Doerfler et al. . |
| 4,999,692 | 3/1991 | Ristic et al. . |
| 5,027,059 | 6/1991 | de Montgolfier et al. . |
| 5,053,695 | 10/1991 | Canter ............................. 324/117 R |
| 5,066,904 | 11/1991 | Bullock . |
| 5,309,086 | 5/1994 | Johansson ....................... 324/117 R |

OTHER PUBLICATIONS

"Electrical Measurements" from Electrical Engineering Texts by Frank A. Laws, Mass. Institute of Tech. 1938, pp. 72–75.

"Faraday Effect Sensors: The State of the Art," GW Day, AH Rose, SPIE Vo. 985, Fiber Optic and Laser Sensors VI(1988), pp. 138–150.

"Integrated Semiconductor Magnetic Field Sensors," Henry P. Baltes, Proceedings of the IEEE, vol. 74, No. 8, Aug. 1986, pp. 1107–1132.

"GE Type EV and Phase3 Meters, Signal Conditioning and Scaling," Donald F. Bullock, David D. Elmore, GE Meter & Control Business, Somersworth, N.H. 03878, Mar. 1991.

"Differential Current Sensing Method and Apparatus," Ser. No. 08/043,903, FIled Apr. 7, 1993.

*Primary Examiner*—Kenneth A. Wieder
*Assistant Examiner*—Kourosh Cyrus Khosravi
*Attorney, Agent, or Firm*—Enrique J. Mora; Marvin Snyder

[57] ABSTRACT

A current sensor for measuring a primary electrical current inducing a magnetic flux density defined over a known region comprises: a first sensor for measuring magnetic flux due to the primary current over a first predetermined area included within the known region; and a second sensor for measuring magnetic flux due to the primary current over a second predetermined area within the known region, the magnetic flux due to the primary current measured by the second sensor being a substantially predetermined calibrated amount different from the magnetic flux due to the primary current measured by the first sensor. The current sensor may further include a current source for generating a current inducing a magnetic flux density within the known region to at least partially offset the difference between the magnetic flux due to the primary current measured by the first sensor and the magnetic flux due to the primary current measured by the second sensor.

28 Claims, 3 Drawing Sheets

REDUCED MAGNETIC FLUX CURRENT SENSOR

RELATED APPLICATIONS

This application is related to patent application Ser. No. 08/119,269 entitled "Reduced Magnetic Field Line Integral Current Sensor," by Berkcan, filed Sep. 9, 1993, patent application Ser. No. 08/085,789 entitled "Reduced Time Rate of Change Magnetic Flux Current Sensor," by Berkcan, filed Jul. 6, 1993, patent application Ser. No. 08/085,787 entitled "Noninductive Shunt Current Sensor," by Berkcan, filed Jul. 6, 1993, patent application Ser. No. 08/085,790 entitled "Current Sensor Employing a Mutually Inductive Current Sensing Scheme with a Magnetic Field Substantially Uniform in Angular Direction," by Berkcan et al., filed Jul. 6, 1993, and patent application Ser. No. 08/085,788 entitled "Current Sensor Employing a Mutually Inductive Current Sensing Scheme," by Berkcan et al., filed Jul. 6, 1993, all of the foregoing assigned to the assignee of the present invention and herein incorporated by reference.

FIELD OF THE INVENTION

This invention relates to current sensors and, more particularly, to a current sensor that measures current by at least in part measuring the magnetic flux through the current sensor due to the current to be measured or sensed.

BACKGROUND OF THE INVENTION

Current sensors, such as described in U.S. Pat. No. 5,066,904, entitled "Coaxial Current Sensors," by Bullock, issued Nov. 19, 1991, assigned to the assignee of the present invention and herein incorporated by reference, are known in the art. These sensors, although useful, suffer from some disadvantages including the need for a current shunt to help reduce the expense of the current sensor by reducing the number of ampere-turns in the active part of the current sensor while still obtaining an accurate measurement of the current. However, even the use of an accurate current shunt typically introduces some expense due to the current sensor materials needed, such as low temperature coefficient materials, the large number of coil "turns" in the sensing and feedback coils of the current shunt, as well as the manufacturing care required to fabricate the current sensor. Thus, a need exists for a current sensor that overcomes these problems.

SUMMARY OF THE INVENTION

One object of the invention is to provide a current sensor based on measuring, at least in part, a calibrated offset related to the magnetic flux through the current sensor due to the current to be sensed.

Another object of the invention is to provide a current sensor that eliminates the need for a current shunt.

Briefly, in accordance with one embodiment of the invention, a current sensor for measuring a primary electrical current inducing a magnetic flux density defined over a known region comprises: a first sensor for measuring the magnetic flux due to the primary current over a first predetermined area included within the known region; and a second sensor for measuring the magnetic flux due to the primary current over a second predetermined area included within the known region, the magnetic flux due to the primary current measured by the second magnetic flux sensor being a substantially predetermined calibrated amount different in relation to the primary current from that measured by the first magnetic flux sensor. The current sensor may further include a current source for generating a current inducing a magnetic field having a magnetic flux density within the known region oriented with respect to the magnetic flux sensors so as to at least partially offset the difference between the magnetic flux due to the primary current measured by the first magnetic flux sensor and the magnetic flux due to the primary current measured by the second magnetic flux sensor.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may be best be understood by reference to the following detailed description when read with the accompanying drawings in which:

DETAILED DESCRIPTION OF THE INVENTION

Figure 1:
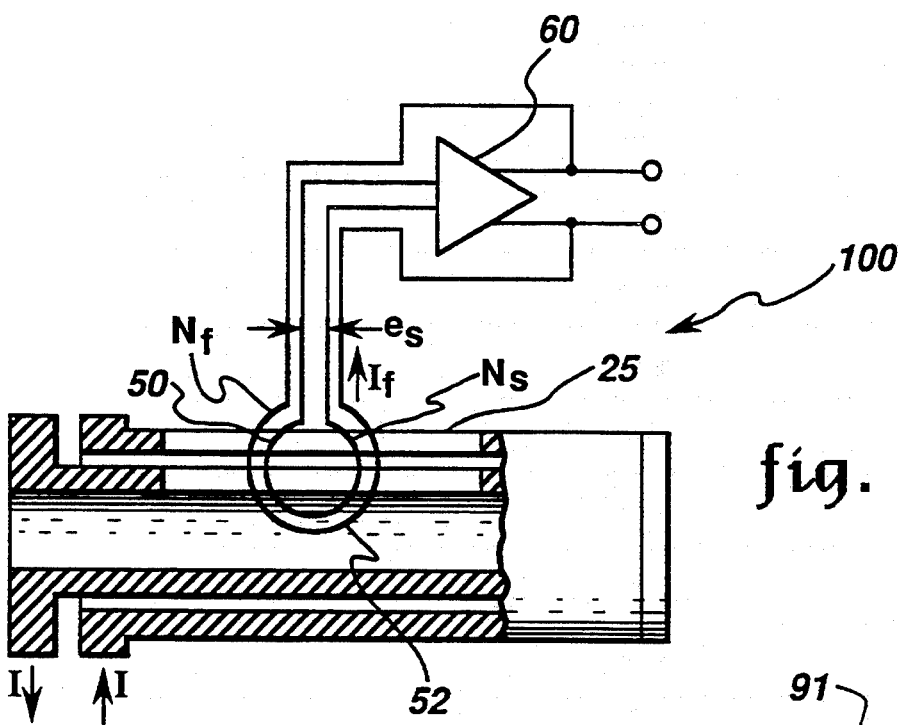
FIG. 1 is a schematic diagram of an embodiment of a magnetic flux cancelling current sensor.

FIG. 1 illustrates an embodiment of a current sensor 100 in which magnetic flux cancelling occurs. In general, the use of such a current sensing scheme entails supplying an ampere-current equal, but opposite, to the changes in magnetic flux due to the primary electrical current through the current sensor and to be measured. In the context of the invention, changes in magnetic flux refers to the time rate of change of magnetic flux, whereas magnetic flux refers to the integral of the magnetic induction or magnetic flux density over a predetermined area. Likewise, in the context of the invention, the terms magnetic induction and magnetic flux density are used interchangeably.

For the current sensor illustrated in FIG. 1, a magnetic field substantially uniform in angular direction and, thus, having substantially parallel magnetic field lines is present between two conductive hollow cylinders comprising the current sensor, such as one of the type described in aforementioned patent application Ser. No. 08/085,790. The direction of current flow through the sensor is illustrated by arrows, although the sensor may also accommodate current flow in an opposing direction. As illustrated, a slot or opening 25 in the cylinders provides access to the magnetic field for a sensor or element for sensing changes in magnetic flux, such as a conductive coil. The primary current through the current sensor induces a magnetic flux density substantially defined over a known area, such as a cross-sectional area of the current sensor. A first sensor or sensing element 50 for sensing changes in magnetic flux, such as a conductive coil, provides measurements of the changes in magnetic flux due to the primary current over a first predetermined area, in this embodiment the area being determined by the sensing element. Thus, as illustrated in FIG. 1, sensing element 50 may comprise a conductive coil having a predetermined cross-sectional area. Likewise, a current source, such as coil 52 coupled to either the output terminals of an amplifier or possibly between an output terminal and ground, is provided for generating a current inducing changes in magnetic flux over a second predetermined area within the known region to offset the changes in magnetic flux due to the primary current. In FIG. 1, the second predetermined area is illustrated as within the first predetermined area. As illustrated, the current source may comprise a coil 52 coupled or connected to the output terminal or terminals of an instrumentation, differential, or operational amplifier 60 whose input terminals are connected or coupled to sensing element or coil 50. Thus, as illustrated, a current induced by sensor or sensing element 50 for sensing changes in magnetic flux is provided to amplifier 60 and amplified to provide a feedback voltage that induces a feedback current to cancel the changes in magnetic flux of the primary current. This may be shown or illustrated mathematically as follows, although it will be appreciated that for brevity the explicit dependency of magnetic flux on spatial parameters is omitted and a more detailed analysis may be performed depending upon the particular geometric configuration employed.

The emf is given by $$e_s = N_s \frac{d}{dt}(\phi_p - \phi_2),\qquad [1]$$

where $\phi_p$ and $\phi_2$ refer to the magnetic flux attributed to or due to the primary current, I, over the area of the sensing element 50 and the magnetic flux attributed to or due to the current source or feedback current over the area of the feedback coil, respectively. Thus, based on Ampere's law, $$\phi_2 \alpha N_f I_f$$

$$\phi_p \alpha I \qquad [1]$$

resulting in $$e_s \alpha N_s I - N_s N_f \frac{d}{dt} I_f. \qquad [3]$$

Next, requiring $e_s = 0$ in the above relationship provides $$I_f \alpha \frac{I}{N_f}. \qquad [4]$$

Due to the relationship illustrated in equation [4] regarding the primary current and the number of coil turns in the feedback or second coil for cancelling the changes in magnetic flux due to the primary current, a current shunt may be used to divide the current to be sensed. This may be followed by a second division to reduce the current further. Unfortunately, even for the embodiment previously illustrated, an accurate current shunt is sometimes not economic to produce because of the cost of carefully fabricating a shunt with the number of turns to achieve the measurement accuracy desired. Likewise, temperature variations may introduce accuracy problems for the shunt.

Figure 2A:
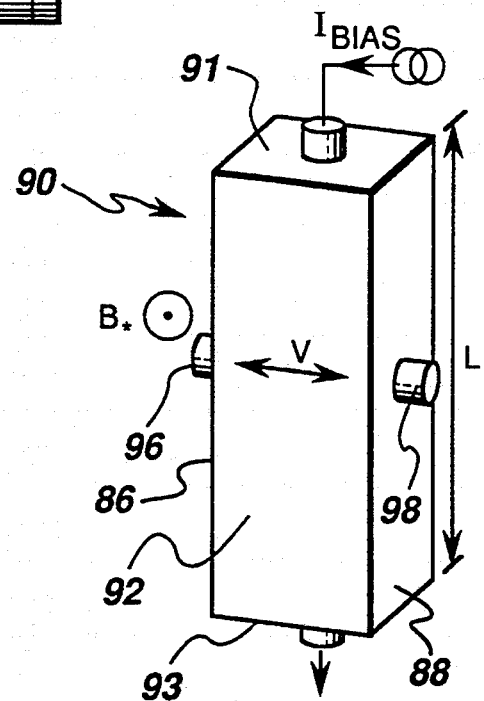
FIG. 2a is a schematic diagram of one embodiment of a semiconductor magnetic field sensor, such as a Hall effect sensor, that may be incorporated in an embodiment of a reduced magnetic flux current sensor in accordance with the invention.
Figure 2:
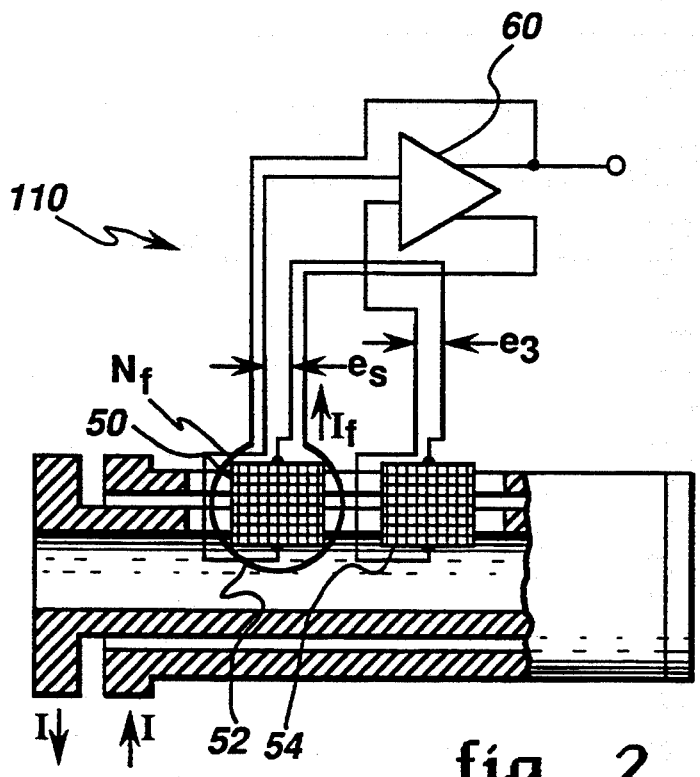
FIG. 2 is a schematic diagram of an embodiment of a reduced magnetic flux current sensor in accordance with the invention.
Figure 3:
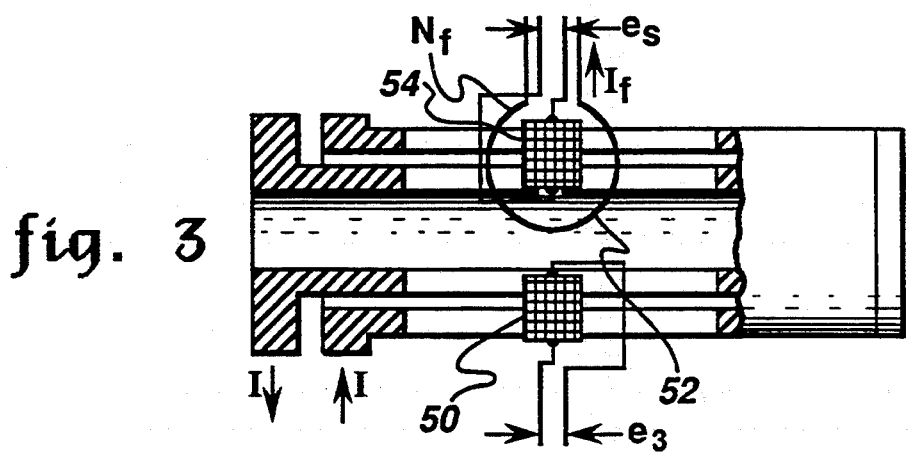
FIG. 3 is a schematic diagram of an alternative embodiment of a reduced magnetic flux current sensor in accordance with the invention.

In contrast with the previously described current sensor, a reduced magnetic flux current sensor 110 in accordance with the invention, such as illustrated in the embodiment of FIG. 2, comprises a first sensor or sensing element 50 for sensing the magnetic flux due to the primary current over a first predetermined area, such as a Hall effect sensor or other semiconductor magnetic field sensor, and a second reference sensor or sensing element 54 for sensing magnetic flux due to the primary current over a second predetermined area, again in this particular embodiment a Hall effect sensor or other semiconductor magnetic field sensor. Current sensor 110 is configured so that the magnetic flux due to the primary current over a second predetermined area measured by the second sensor or sensing element 54 is a substantially predetermined, calibrated amount different from the magnetic flux due to the primary current over a first predetermined area measured by the first sensor or sensing element 50, the magnetic flux measured by the second sensor being partially offset a calibrated amount in relation to the primary current from the magnetic flux measured by the first sensor. This may be achieved, for example, by using a reference sensor or second sensing element to provide a reference measurement of magnetic flux, such as provided by Hall effect sensor 54 in the amplifier configuration illustrated in FIG. 2.

In the context of the invention, a sensor or sensing element for measuring magnetic flux refers to a detector or other sensing system responsive, at least in part, to magnetic induction or a magnetic flux density induced by a primary electrical current with reference to or within a known or specified geometric region. The detector or sensing system thereby provides a measurement related to the magnetic flux over that region, such as indicated by equation [5] below or by a substantially equivalent relationship. In particular, such detectors include, but are not limited to, semiconductor magnetic field sensors based upon the Lorentz force, such as: Hall effect sensors that detect the Hall voltage; bipolar magneto-transistors; magnetic field effect transistors; magnetic diodes; and other magneto-transistors, some of which are described in "Integrated Semiconductor Magnetic Field Sensors," written by H. P. Baltes, and R. S. Popovic, published in *Proceedings of the IEEE*, Vol. 74, No. 8, August, 1986, and herein incorporated by reference. Such sensors are also described in other textbooks and publications, such as in chapters 2, 3, 4, and 6 of *Structure and Application of Galvanomagnetic Devices*, by H. Weiss, available from Pergamen Press, (1969) and in chapters 3 and 4 of *Hall Generators and Magneto Resistors*, by H. H. Weider, available from Pion, LTD. (1971). The quantity to be compared or measured by such a sensor is related to the magnetic flux over a known region due the magnetic induction or magnetic flux density within or for the region, and, in a general, but simplified form, is related in a geometrical constant G times a component $B_x$ of the magnetic induction, and a bias factor Y in accordance with the following, or an equivalent, relationship.

$$V_s \alpha B_x G\, Y \qquad [5]$$

where Vs may represent a the voltage signal produced by the sensor. As previously mentioned, explicit geometric dependencies have been omitted for brevity. The component $B_x$ may, for example, be the magnetic induction component substantially perpendicular to the top face of the sensor when using a Hall effect sensor, such as illustrated in FIG. 2a by face 92, or when using a magnetic field effect transistor. Alternatively, it may be the magnetic field component parallel to the surface of the sensor when using a bipolar magneto-transistor. Likewise, the bias factor Y may simply be a bias current, $I_{bias}$, as in the case of a Hall effect sensor and illustrated in FIG. 2a, whereas in the case of a bipolar magneto-transistor, Y may be a relatively complex function of the bias point parameters including the base current, the substrate, and the emitter and collector voltages, such as described in R. S. Popovic, and H. P. Baltes, "Dual-Collector Magnetotransistor Optimized with Respect to Injection Modulation," *Sensors and Actuators*, Vol. 4, pp. 155–163, 1983, and R. S. Popovic, and R. Widmer, "Sensitivity and Noise of a Lateral Bipolar Magnetotransistor in CMOS Technology," *IEDM Tech. Dig.*, pp. 568–571, December 1984. The details regarding the electrical connections in FIGS. 2, 3, 4, 5, and 6 to provide a bias current or other device bias operating point or to obtain a voltage measurement with respect to the semiconductor magnetic field sensor are omitted for convenience; however, a possible schematic configuration is illustrated in FIG. 2a and described below.

A schematic diagram of one embodiment of a semiconductor magnetic field sensor, such as a Hall effect sensor, is provided in FIG. 2a. Nonetheless, as previously mentioned, the invention is not limited in scope to using Hall effect sensors to measure magnetic flux or magnetic flux density. Furthermore, the invention is not limited in scope to semiconductor magnetic field sensors employing the particular shape or topology illustrated. As illustrated in FIG. 2a, a bias current, $I_{bias}$, is conducted between opposing end faces 91 and 93 of Hall effect sensor 90. Hall effect sensor 90 may be comprised of a semiconductor material, such as indium arsenide, gallum arsenide or indium antimonide. As a result of electrical current conduction in the presence of a magnetic field, such as magnetic induction B* illustrated as directed "into" the figure substantially perpendicular to top face 92 of Hall effect sensor 90, a Lorentz force affects the electron flow between the opposing end faces of the Hall effect sensor. Due to this current flow and the Lorentz force, a voltage potential, V, is present between opposing metal contact terminals 96 and 98 contacting the side faces 86 and 88 of the Hall effect sensor 90. Thus, a measurement of this voltage provides a measurement of the magnetic flux, and hence the magnetic flux density of the magnetic field, substantially in accordance with equation [5] as previously described.

Returning to the embodiment illustrated in FIG. 2, coil 52 has a plurality of coil turns $N_f$ and is coupled to amplifier 60, such as a differential or instrumentation amplifier, to provide a current source for generating a feedback current inducing a magnetic field having a magnetic flux density to at least partially or even substantially, offset the difference between the magnetic flux due to the primary current measured by first sensing element 50 in FIG. 2 and the magnetic flux due to the primary current measured by second or reference sensing element 54 in FIG. 2. Although the cross-sectional areas of sensors 50 and 54 are illustrated as being oriented substantially perpendicular to the direction of the magnetic field, it will now be appreciated that the cross-sectional area of the sensors, such as the surface of a semiconductor magnetic field sensor, may be oriented at a predetermined angle with respect to the primary magnetic field other than substantially perpendicular so long as this orientation or predetermined angle is taken into account with regard to sensing and offsetting the measurement of the magnetic flux due to the primary current by the sensors. Likewise, coil 52 may have a cross-sectional area oriented at a predetermined angle with respect to the direction of the primary magnetic field, such as substantially perpendicular to it. It will also be appreciated that the second or reference sensor for sensing magnetic flux due to the primary current also need not measure magnetic flux over an area in common or incorporated within the cross-sectional area of the first sensing element. However, it may be desirable or convenient for coil 52 to have a cross-sectional area oriented with respect to the cross-sectional area of the first sensing element so that the magnetic induction due to the current generated at least partially offsets the magnetic flux due to the primary current measured by the first sensor. More precisely, for such an embodiment, coil 52 may be oriented relative to the first sensor so that the magnetic induction due to the feedback current results in a Lorentz force affecting electrons in the current flow through the first sensor to at least partially offset or oppose the Lorentz force on the electrons in the current flow through the first sensing element associated with the primary magnetic field induced by the primary current. Of course, the invention is not limited in scope to offsetting or opposing the Lorentz force associated with the primary magnetic field on the electrons flowing through the first sensor. For example, alternatively the Lorentz force associated with the primary magnetic field on electrons in the current flow through the second sensor may be affected or offset. Thus, in one embodiment of the invention, the first sensor or sensing element may sense or measure magnetic flux due to the primary current over a first predetermined area, and the second sensor or sensing element may sense or measure magnetic flux due to the primary current over a second predetermined area, the magnetic flux due to the primary current measured by the second sensor being a substantially predetermined calibrated amount different in relation to the primary current from that measured by the first sensor. The embodiment may further include, if provided, a current source for generating a current to induce a magnetic field oriented with respect to the first sensor so that the magnetic flux density due to the current generated at least partially offsets the magnetic flux due to the primary current measured by the first sensor.

As illustrated in FIG. 2, the difference between the voltage output signals of Hall effect or semiconductor magnetic field sensors 50 and 54 are provided to the input terminals of amplifier 60 by a reverse series connection or configuration to provide an offsetting magnetic flux measurement and corresponding voltage signal. In this embodiment of a reduced magnetic flux current sensor in accordance with the invention, $e_s$ is now given by:

$$e_s \alpha G(B_{xp} - B_{x2})Y \quad [6]$$

in place of equation [1], where $B_{xp}$ is the magnetic flux density attributable to the primary current over the cross-sectional area of sensing element 50, and $B_{x2}$ is the magnetic flux density attributable to the feedback coil within its cross-sectional area. Likewise, based on Ampere's law, $$B_{xp} \alpha I$$

and $$B_{x2} \alpha N_f I_f$$

Thus, $$e_s \alpha GY(I - N_f I_f) \quad [7]$$

Now the condition that $e_s = e_3$, based in the configuration illustrated in FIG. 2, provides the following equation:

$$GY(I - N_f I_f) = G_3(Y - \delta)I \quad [8]$$

where $Y_3 = Y - \delta$, for simplification and to provide the desired predetermined calibrated offset. Likewise, $$I_f \alpha \frac{G_3(\delta - Y) + GY}{GYN_f} I = \quad [9]$$

$$\frac{I}{N_f} - \frac{G_3}{G} \frac{Y - \delta}{YN_f} I,$$

If $G_3 = G$ for further simplification, $$I_f \alpha \frac{I}{N_f} - \frac{Y - \delta}{YN_f} I. \quad [10]$$

Comparing equation [10] to equation [4] leads to the conclusion that here only a small current, $I_f$, relative to the current sensor illustrated in FIG. 1, need be supplied, because the magnetic flux due to the primary current measured by the first sensor is being reduced or offset by the feedback current by a much smaller value in comparison with the changes in magnetic flux cancelled in the earlier approach. Thus, a smaller number of ampere-turns now being required to accommodate a smaller current, as well as removing the need for a current shunt, results in an economical and desirable current sensor. In FIG. 2, the feedback current, $I_f$, in coil 52 is proportional to the original or primary current to be sensed and provides an accurate sense current measurement. Likewise, avoiding a current shunt may avoid inaccuracies in the current measurements associated with the temperature dependence of the materials used for the current shunt.

Although the previous description indicates that the reference or second sensing element may provide a measurement of the magnetic flux due to the primary current a substantially predetermined calibrated amount different from the first sensing element by employing a different bias factor or bias current, as previously described, the invention is not restricted in scope to this approach. For example, instead of using a different bias factor, a different cross-sectional area over which to measure the magnetic flux may be employed. Likewise, the sensors may, for example, be comprised of different materials, may have different electron mobilities, or may be differently doped. In general, any technique that suitably calibrates or relates the difference in measurements of the magnetic flux due to the primary current between the first sensing element and the second sensing element may be employed. Likewise, this predetermined calibrated difference established between the two sensing elements does not require that the magnitude of the magnetic flux due to the primary current measured by the first sensing element exclusively exceed that of the second sensing element or vice-versa, so long as the difference may be sufficiently calibrated or, alternatively, may be offset by a current source, as previously described. Likewise, this offset may be performed by a number of techniques, such as conventional signal processing performed by software embedded in a microprocessor.

Figure 4:
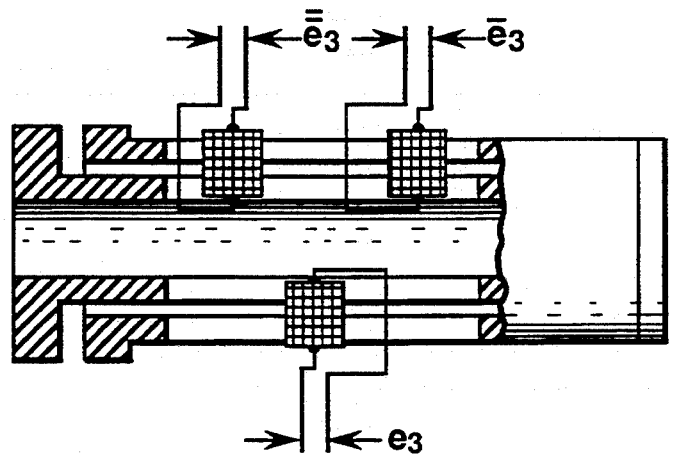
FIG. 4 is a schematic diagram of an alternative geometric arrangement of reference sensors for sensing magnetic flux, such as may be employed in an embodiment of a reduced magnetic flux current sensor in accordance with the invention.

In alternative embodiments, the reference or second sensing element may be placed in alternative locations in the current sensor including the opposite side of a current sensor of the type described in patent application Ser. No. 08/085,790. This is shown schematically in FIG. 3 with the details regarding the amplifiers omitted for convenience. Likewise, as illustrated in FIG. 4, additional sensing elements may be introduced to improve the signal obtained and provide additional immunity against external magnetic fields, and hence, more robust measurements. As illustrated, the three sensing elements, such as Hall effect sensors, are geometrically arranged with respect to one another. Thus, the differences between the voltages generated by various selected pairs of sensing elements may be used to measure the external magnetic fields that vary in diverse directions, such as along the cylinders. This technique may also be employed to provide a measurement of the magnetic fields varying in the direction orthogonal to the cylinders or their major axes.

One aspect of a reduced magnetic flux current sensor in accordance with the present invention that employs semiconductor magnetic field sensors, as previously described, is a possible inductive voltage signal introduced due to the time rate of change of a time varying magnetic induction. This may occur, for example, due to changes in the current flowing through one of the sensors for measuring the magnetic flux due to the primary current. This inductive voltage signal due to the time rate of change of the magnetic induction may affect the magnetic flux measurements of the sensor. One approach to solving this problem might entail providing a single turn conductive coil coupled in a reverse or negative series configuration with the voltage across the particular semiconductor magnetic field sensor to substantially offset any such inductive voltage.

Likewise, the current source for generating a current to induce an at least partially offsetting magnetic field may be implemented a number of ways. For example, a transconductance amplifier may be employed that converts voltage, such as the voltage provided by the reversed series connection of sensors 50 and 54, to current. This may be conventionally implemented by an operational amplifier or instrumentation amplifier coupled to a buffer amplifier. Likewise, other conventional embodiments may be employed, such as described in *Modern Electronic Circuits Reference Manual*, by John Markus and available from the McGraw-Hill Book Company (1980) or in *IC Op-Amp Cookbook*, 3d Ed., by Walter C. Jung, and available from MacMillian, Inc. (1993).

Figure 5:
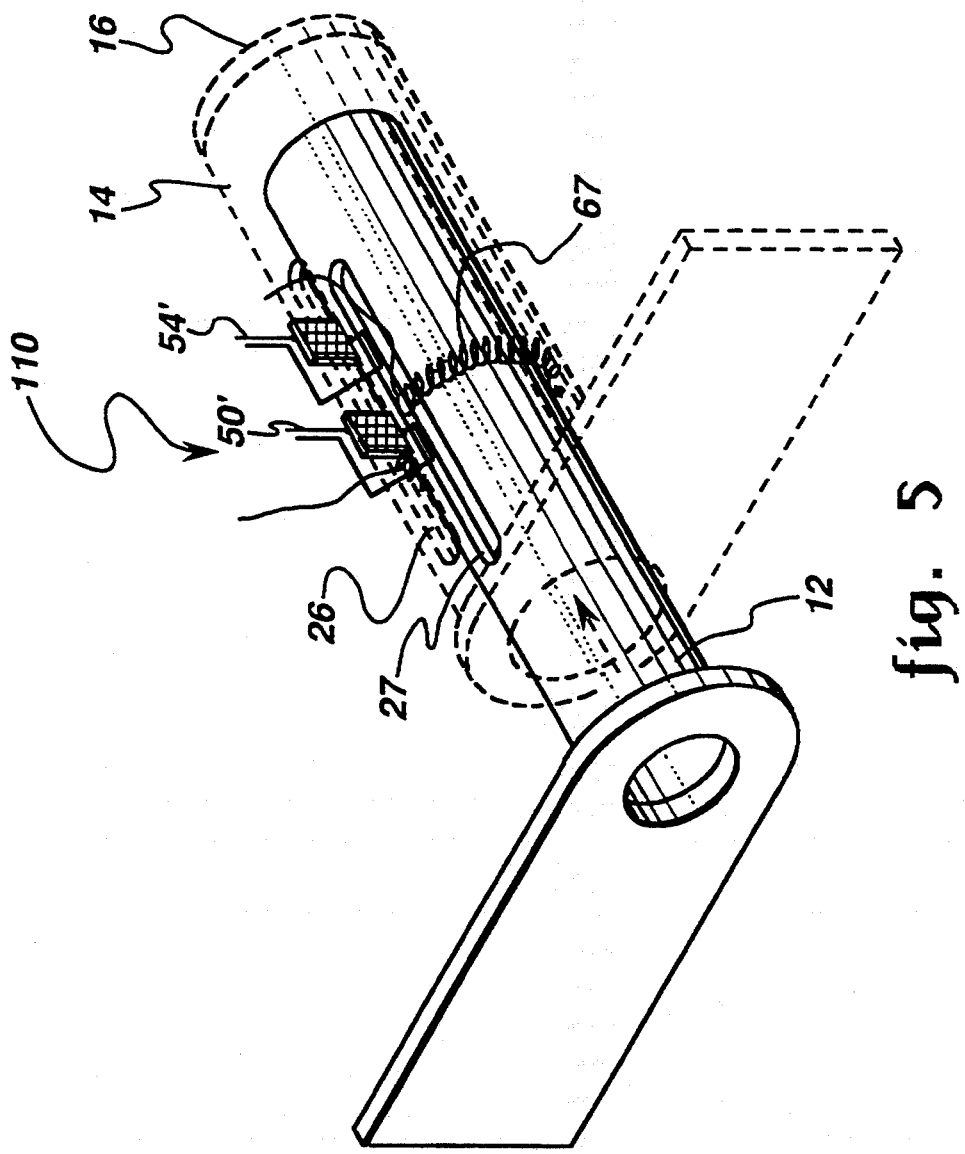
FIG. 5 is yet another embodiment of a reduced magnetic flux current sensor in accordance with the invention.

FIG. 5 illustrates yet another embodiment of a reduced magnetic flux current sensor in accordance with the present invention. It will now be appreciated that many different embodiments of a reduced magnetic flux current sensor are possible and the invention is not limited in scope to the particular embodiments described herein. As previously described, a sensing element for measuring magnetic flux over a predetermined area may comprise, for example, a semiconductor magnetic field sensing device. Likewise, the sensors or sensing elements for sensing magnetic flux may, alternatively, comprise, optical sensors, or other sensors that may be employed in various configurations to measure magnetic flux. For example, a conductive coil that measures the time rate of change of the magnetic flux may be coupled to a conventional integrator or other conventional signal processor to provide such a magnetic flux measurement. Likewise, different magnetic flux sensors may be combined in one embodiment. Furthermore, the invention is not restricted in scope to having all the sensing elements and current sources in the same plane or in opposing locations in the body of the current sensor. For example, as illustrated in FIG. 5, instead of coil 52 illustrated in FIG. 2, a toroidal feedback coil 67 may be placed or located in the space between the inner surface of cylinder 14 and the outer surface of cylinder 12. This particular configuration exploits and preserves the lack of a magnetic field outside outer cylinder 14 or inside inner cylinder 12. More particularly, since the magnetic field inside the toroid is substantially uniform in angular direction it is thus substantially perpendicular to the top face of sensor 50' for the first sensing element and the top face of sensor 54' for the second or reference sensing element in slots 26 and 27 in the cylinders illustrated in FIG. 5. This may provide a stronger signal due to the concentrated magnetic field between the cylinders, offering the possibility of enhanced current measurements. Furthermore, the toroidal coil may be embedded in or wound around a ferromagnetic material, such as ferrite or $\mu$-metal, filling the space between the cylinders to further enhance the magnetic field established.

A reduced magnetic flux current sensor in accordance with the present invention has a number of advantages. First, as previously suggested, there is substantially no magnetic field inside the inner cylinder or outside the outer cylinder of the two cylinders, where that particular embodiment is employed. This is particularly advantageous for metering applications, where, as previously discussed, several current sensors are employed in close proximity to each other, such as in a three-phase network. Likewise, this avoids the need for magnetic insulation which is undesirable and, furthermore, may not provide effective insulation in the presence of magnetic fields having a strong DC component which may saturate the insulating material. Yet another advantage is that the current sensor is relatively insensitive to external magnetic fields, such as the magnetic field due to the conductors to the current source and other sources of noise. This occurs at least in part because the sensors or sensing elements for sensing magnetic flux are located in a plane perpendicular to the direction of a magnetic field substantially uniform in angular direction so that the cross product of these external fields with the current flow through the sensing elements and hence, the Lorentz force, may be essentially zero. It may be demonstrated that the current sensor is not only insensitive to uniform external magnetic fields, but also uniform temperature effects. Likewise, the effects of external magnetic field gradients and temperature gradients may be corrected by conventional digital signal processing techniques. Finally, the effect of noise on this type of feedback configuration is at least no worse and possibly better than other alternative types of current sensor configurations, such as the aforementioned U.S. Pat. No. 5,066,904.

Yet another advantage of a reduced magnetic flux current sensor in accordance with the invention in which the magnetic flux density is concentrated in the space, or the predetermined radial distance or separation, between the outer surface of the outer pipe and the inner surface of the inner pipe, where an inner pipe is used, in addition to improving accuracy, is that the current sensor structure is simplified in comparison with alternative current sensor structures, making it relatively easy to manufacture. As previously discussed, the sensitivity of the current sensor may be improved further by the use of a toroidal feedback coil as illustrated in FIG. 5. Furthermore, several sensing elements may be inserted at arbitrary locations between the outer pipe and an inner cylindrical conductive element or pipe, thus providing a better measurement of the current due to the improved signal obtained. In particular, as illustrated in FIG. 4, the placement of the reference sensing elements may be employed to improve the measurement obtained. Further, as described in more detail hereinafter, an embodiment of a reduced magnetic flux current sensor in accordance with the invention may be made to accommodate at least two other current sensing schemes, such as those described in patent application Ser. No. 08/085,790 and in patent application Ser. No. 08/085,787, thereby effectively providing three current measurements in one device. Nonetheless, it will now be appreciated that although offering a convenient embodiment, a reduced magnetic flux current sensor in accordance with the invention is not restricted to the concentric pipes or hollow cylinders configuration previously discussed. For such other embodiments of a reduced magnetic flux current sensor in accordance with the invention, the need for a current shunt is nonetheless avoided thus removing inaccuracies due to temperature variations and reducing the expense of the current sensor, as previously suggested.

FIG. 5, discussed previously, illustrates an embodiment of a reduced magnetic flux current sensor in accordance with the invention that may also accommodate the current sensing schemes described in patent application Ser. No. 08/085,790 and in patent application Ser. No. 08/085,787. As illustrated, current sensor 110 comprises a pair of concentric hollow cylinders or pipes, 12 and 14, electrically connected by a conductive bridge such as a washer 16, thus enabling the noninductive shunt current sensor as described in patent application Ser. No. 08/085,787. Likewise, conductive coil 67, is provided in the space between the outer surface of pipe 12 and the inner surface of pipe 14. This coil may be employed in a mutually inductive current sensing scheme with a magnetic field substantially uniform in angular direction, such as described in patent application Ser. No. 08/085,790. Finally, as previously discussed, sensors 50' and 54' may respectively correspond to sensors 50 and 54 illustrated in FIG. 2 to provide a reduced magnetic flux current sensor in accordance with the invention.

Figure 6:
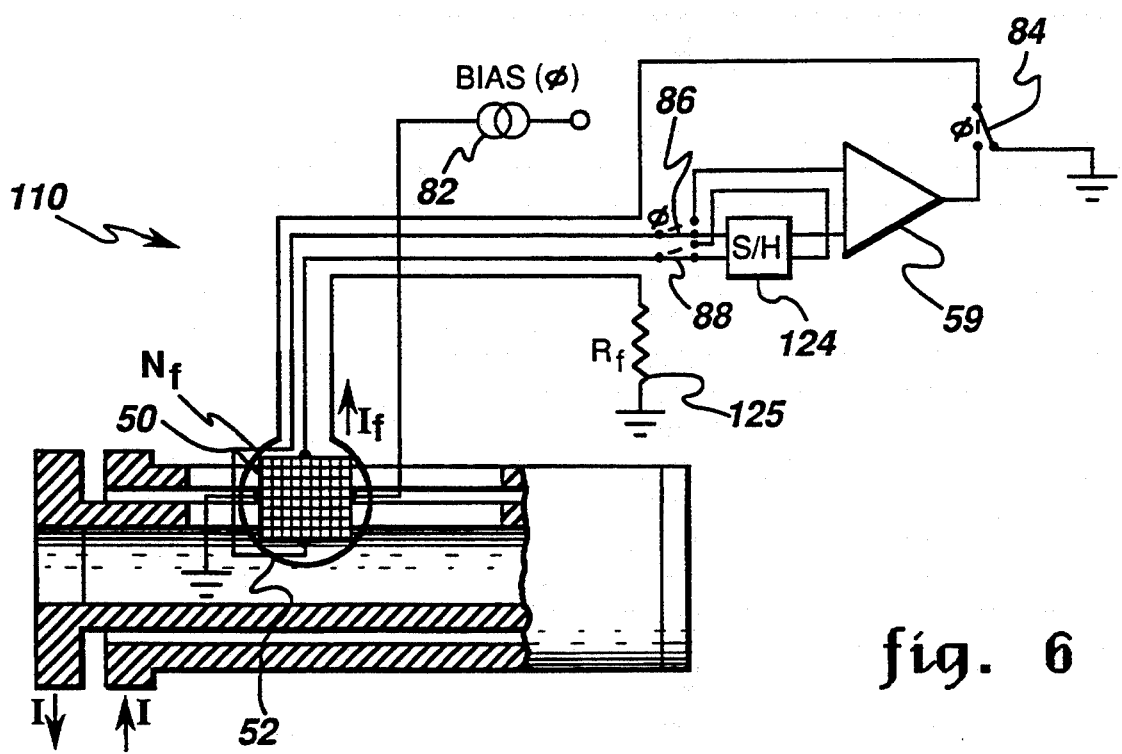
FIG. 6 is one more embodiment of a reduced magnetic flux current sensor in accordance with the invention.

Yet another embodiment of a reduced magnetic flux current sensor in accordance with the invention may, instead of comparing two different measurements of magnetic flux due to the primary current at substantially the same time using two semiconductor magnetic field sensors, may compare two measurements of magnetic flux due to the primary current at two substantially different times and thereby employ only one sensor. For example, as illustrated in FIG. 6, current sensor 110 may comprise: a sensor 50 for sensing or measuring the magnetic flux due to the primary current over a predetermined area at two successive, predetermined times; a conventional sample and hold circuit 124, or other signal storage device for storing at least the first magnetic flux measurement obtained by sensor 50; and a current source, such as coil 52 coupled to the output voltage terminal of an amplifier 59 and to ground, for inducing a magnetic field, providing a magnetic flux density, to at least partially offset the difference between the two magnetic flux measurements, again as previously described. As illustrated, switches 84, 86, and 88 are synchronized to operate at substantially the same time, such as may be accomplished with a three-pole, double-throw switch.

In this particular embodiment, current bias 82 applies a substantially predetermined current to sensor 50. Sensor 50 may comprise, for example, a semiconductor magnetic field sensor of the type previously described. Likewise, circuit 124 may comprise a conventional electrical sample and hold circuit, such as an operational amplifier, having its output voltage terminal coupled in a negative feedback configuration with a capacitor coupled to the positive input terminal of the operational amplifier. At this time, feedback coil 52 is grounded by the positioning of switch 84, as indicated. Likewise, switches 86 and 88 couple sensor 50 to sample and hold circuit 124 so that the first measurement of magnetic flux due to the primary current obtained by sensor 50 may be stored. This embodiment may be driven by an externally derived clock pulse signaling the appropriate switching times. Thus, on the next phase of the externally derived clock pulse, designated $\phi$, switches 84, 86, and 88 may change from a first position to a second position. Likewise, at this time, indicated by $\phi$, current bias 82 may also effect a predetermined, calibrated change in the current bias applied to sensor 50. Thus, by the reverse series configuration of sensor 50 and circuit 124 across the input terminals of amplifier 60, amplifier 60 may offset the voltage signal providing the first measurement of magnetic flux due to the primary current obtained at "time one," stored by circuit 124, against the voltage signal providing the second measurement of magnetic flux due to the primary current obtained at "time two," provided directly by sensor 50. Otherwise, this embodiment operates in a manner similar to the embodiments illustrated in FIG. 2. The difference between the measurements of magnetic flux due to the primary current taken at different times provides a feedback current to a current source that induces a magnetic field having a magnetic flux density to reduce or at least partially offset the difference in magnetic flux measurements. Likewise, the feedback current is measured by the voltage "drop" across feedback resistor 125.

A method of measuring a primary electrical current inducing a magnetic flux density at least defined over a known region may be performed in the following manner. The magnetic flux due to the primary current over a first predetermined area within the known region is sensed. The magnetic flux maybe measured or sensed as follows: a bias current may be applied to a Hall effect sensor having a top face oriented substantially perpendicular to the magnetic field due to the primary current to be sensed. The voltage measured across the Hall effect sensor substantially perpendicular to the path of the bias current through the sensor and substantially perpendicular to the primary magnetic field may thereby provide a measurement of the magnetic flux, such as indicated by equation [5] and illustrated in FIG. 2a. Alternatively, in another semiconductor magnetic field sensor, such as a magnetic field effect transistor, measuring the difference between the drain currents of the transistor may provide a measurement of the magnetic flux due to the primary current.

The magnetic flux due to the primary current over a second predetermined area within the known region is also measured or sensed. Furthermore, the magnetic flux due to the primary current is sensed so that the magnetic flux sensed over the first area is a substantially predetermined calibrated amount different from the magnetic flux sensed over the second area in relation to the primary current. A current may then be generated inducing an offsetting magnetic field providing a magnetic flux density oriented to at least partially, or even substantially, offset the difference between the magnetic flux due to the primary current sensed over the first area and the magnetic flux due to the primary current sensed over the second area. The current may be generated as previously described by a conductive feedback coil coupled to an amplifier, such as a differential amplifier. The invention is not restricted in scope to having the magnitude of the magnetic flux due to the primary current over the first area exceed or be less than the magnitude of the magnetic flux due to the primary current sensed over the second area. Thus, it is sufficient that the sensed difference in the magnetic flux due to the primary current be an amount that may be suitably calibrated in relation to the primary current, as previously described. Likewise, generating the current to induce a magnetic flux density to at least partially or substantially offset the difference between the magnetic flux due to the primary current sensed over the first area and the magnetic flux due to the primary current sensed over the second area may also include measuring the current generated. For example, a conventional operational amplifier configuration may provide a voltage signal proportional to the current measurement. Likewise, the measurement of the current generated may then be converted to a measurement of the primary electrical current, such as illustrated by equation [10]. Furthermore, as previously suggested, it may be desirable to have the first predetermined area oriented with respect to the induced magnetic flux density due to the feedback current so that the induced magnetic flux density reduces or at least partially offsets the magnetic flux due to the primary current measured by the first sensor, such as illustrated in FIG. 2. To accomplish this, the Lorentz force associated with the magnetic flux density induced by the feedback current generated that affects electrons in the current flow through the first sensor may oppose or partially offset the Lorentz force associated with the primary magnetic field induced by the primary current also affecting electrons in the current flow through the first sensor.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A current sensor for measuring a primary electrical current inducing a magnetic flux density at least defined over a known region comprising:
    a first sensor for measuring the magnetic flux density due to the primary current over a first predetermined area within the known region; and
    a second sensor for measuring the magnetic flux density due to the primary current over a second predetermined area within the known region, the magnetic flux density due to the primary current measured by said second sensor being a predetermined calibrated amount different from the magnetic flux density due to the primary current measured by said first sensor.

2. The current sensor of claim 1, and further comprising:
    a current source for generating a current inducing a magnetic flux density within the known region to at least partially offset the difference between the magnetic flux density due to the primary current measured by said first sensor and the magnetic flux density due to the primary current measured by said second sensor.

3. The current sensor of claim 2, wherein at least one of said sensors for measuring the magnetic flux density due to the primary current comprises a semiconductor magnetic field sensor.

4. The current sensor of claim 3, wherein said semiconductor magnetic field sensor comprises a sensor selected from the group consisting essentially of a Hall effect sensor, a bipolar magneto-transistor, a magnetic field effect transistor, and a magnetic diode.

5. The current sensor of claim 1, wherein the magnitude of the magnetic flux density due to the primary current said first sensor is adapted to measure exceeds the magnitude of the magnetic flux density due to the primary current said second sensor is adapted to measure.

6. The current sensor of claim 1, wherein the magnitude of the magnetic flux density due to the primary current said second sensor is adapted to measure exceeds the magnitude of the magnetic flux density due to the primary current said first sensor is adapted to measure.

7. The current sensor of claim 1, wherein at least one of said sensors comprises a semiconductor magnetic field sensor, said semiconductor magnetic field sensor having a cross-sectional area oriented at a predetermined angle with respect to the direction of the magnetic field induced by the primary current.

8. The current sensor of claim 7, wherein said at least one semiconductor magnetic field sensor comprises a Hall effect sensor having a cross-sectional area oriented substantially perpendicular with respect to the direction of the magnetic field induced by the primary current.

9. The current sensor of claim 2, wherein said current source comprises a conductive coil coupled to at least one output terminal of an amplifier so as to receive an output voltage signal produced by said amplifier, said coil having a cross-sectional area oriented at a predetermined angle with respect to the direction of the magnetic field induced by the primary current.

10. The current sensor of claim 9, wherein said amplifier has two output terminals, said conductive coil being coupled across the output terminals of said amplifier, the cross-sectional area of said coil being oriented substantially perpendicular with respect to the direction of the magnetic field induced by the primary current.

11. The current sensor of claim 9, wherein said first sensor and said second sensor each comprise a semiconductor magnetic field sensor and are coupled to each other in a reverse series configuration and across the input terminals of said amplifier.

12. The current sensor of claim 2, wherein said first sensor and said current source are oriented with respect to each other so that the magnetic flux density induced by the current generated by said current source at least partially offsets the magnetic flux density due to the primary current measured by said first sensor.

13. The current sensor of claim 8, wherein said second sensor also comprises a Hall effect sensor, said first and second Hall effect sensors each having a substantially predetermined bias current, the bias current in said first sensor being a predetermined calibrated amount different from the bias current in said second sensor.

14. The current sensor of claim 11, and further comprising:
    two concentric pipes forming, respectively, an outer pipe and an inner pipe relative to one another, each having a first end, a second end, an inner surface, an outer surface;
    the respective second ends of said pipes being electrically connected by a conductive bridge to form a connected conductive path between the first end of the inner pipe and the first end of the outer pipe;
    each of said pipes having at least one slot for receiving said first and second semiconductor magnetic field sensors, and said coil, the at least one slot in the outer pipe substantially overlapping the at least one slot in the inner pipe.

15. The current sensor of claim 11, and further comprising:
    two concentric pipes forming, respectively, an outer pipe and an inner pipe relative to one another, each having a first end, a second end, an inner surface, an outer surface;
    the respective second ends of said pipes being electrically connected by a conductive bridge to form a connected conductive path between the first end of the inner pipe and the first end of the outer pipe;
    the outer surface of the inner pipe being spaced a predetermined radial distance from the inner surface of the outer pipe;
    said coil comprising a toroidal coil having a plurality of coil loops, said toroidal coil being located in the space between the outer surface of the inner pipe and the inner surface of the outer pipe, said toroidal coil loops each having a cross-sectional area oriented at a predetermined angle with respect to the direction of the magnetic field induced by the flow of the primary current along the conductive path;
    each of said pipes having at least one slot for receiving said first and second semiconductor magnetic field sensors, the at least one slot in the outer pipe substantially overlapping the at least one slot in the inner pipe.

16. A method of measuring a primary electrical current inducing a magnetic flux density defined over a known region, said method comprising the steps of:
sensing magnetic flux density due to the primary current over a first predetermined area within the known region; and
sensing magnetic flux density due to the primary current over a second predetermined area within the known region, the magnetic flux density due to the primary current sensed over the first area being a predetermined calibrated amount different from the magnetic flux density due to the primary current sensed over the second area.

17. The method of claim 16, and further comprising the step of generating a current inducing a magnetic flux density within the known region to at least partially offset the difference between the magnetic flux density due to the primary current sensed over the first area and the magnetic flux density due to the primary current sensed over the second area.

18. The method of claim 16, wherein the magnitude of the magnetic flux density due to the primary current sensed over the second predetermined area exceeds the magnitude of the magnetic flux density due to the primary current sensed over the first predetermined area.

19. The method of claim 16, wherein the magnitude of the magnetic flux density due to the primary current sensed over the first predetermined area exceeds the magnitude of the magnetic flux density due to the primary current sensed over the second predetermined area.

20. The method of claim 17, wherein the step of generating a current includes the step of measuring the current generated.

21. The method of claim 20, and further comprising the step of converting the measurement of the current generated into a measurement of the primary electrical current.

22. The method of claim 16, wherein the magnetic flux density due to the primary electrical current is sensed by a Hall effect sensor located within the known region, said Hall effect sensor receiving a predetermined bias current, the direction of the bias current received by said Hall effect sensor being oriented at a predetermined angle with respect to the magnetic flux density due to the primary current; and wherein at least one of the steps of sensing magnetic flux density due to the primary current comprises measuring the Hall voltage of said Hall effect sensor.

23. The method of claim 17, wherein the magnetic flux density induced by said generated current is oriented with respect to the first predetermined area so as to at least partially offset the magnetic flux density due to the primary current measured over the first predetermined area.

24. A method of measuring a primary electrical current inducing a magnetic flux density at least defined over a known region, said method comprising the steps of:
sensing magnetic flux density due to the primary current over a predetermined area within the known region at a first predetermined time; and
sensing magnetic flux density due to the primary current over the predetermined area within the known region at a second predetermined time after the first predetermined time, the magnetic flux density due to the primary current sensed at the first predetermined time being a predetermined calibrated amount different from the magnetic flux density due to the primary current sensed at the second predetermined time.

25. The method of claim 24, and further comprising the step of generating a current inducing a magnetic flux density within the known region to at least partially offset the difference between the magnetic flux density due to the primary current sensed at the first predetermined time and the magnetic flux density due to the primary current sensed at the second predetermined time.

26. A current sensor for measuring a primary electrical current inducing a magnetic flux density defined over a known region comprising:
a sensor for measuring magnetic flux density due to the primary current over a predetermined area within the known region at a first predetermined time and at a second predetermined time so that the magnetic flux density due to the primary current measured over the predetermined area at the first predetermined time is a predetermined calibrated amount different from the magnetic flux density due to the primary current measured over the predetermined area at the second predetermined time; and
a signal storage unit coupled to said sensor so as to receive a signal from said magnetic flux sensor providing the measurement of magnetic flux density due to the primary current measured over the predetermined area by said magnetic flux sensor at the first predetermined time.

27. The current sensor of claim 26, wherein said signal storage unit comprises an electrical sample and hold circuit and the signal providing the measurement of magnetic flux density due to the primary current measured by said magnetic flux sensor over the predetermined area at the first predetermined time comprises a voltage signal.

28. The current sensor of claim 27, and further comprising:
a current source for generating a current inducing a magnetic flux density within the known region to at least partially offset the difference between the voltage signal stored in said signal storage unit, said stored signal constituting the measurement of magnetic flux density due to primary current measured by said magnetic flux sensor over the predetermined area at the first predetermined time, and a voltage signal constituting the measurement of magnetic flux density due to the primary current measured by said magnetic flux sensor over the predetermined area at the second predetermined time.

* * * * *